US005872019A

United States Patent [19]
Lee et al.

[11] Patent Number: 5,872,019
[45] Date of Patent: Feb. 16, 1999

[54] METHOD FOR FABRICATING A FIELD EMITTER ARRAY INCORPORATED WITH METAL OXIDE SEMICONDUCTOR FIELD EFFECT TRANSISTORS

[75] Inventors: Jong Duk Lee, Department of Electronics Engineering, College of Engineering, Seoul National University, Shin Lim-Dong, Kwank-ku, Seoul; Hyung Soo Uh, Seoul, both of Rep. of Korea

[73] Assignees: Korea Information & Communication Co., Ltd.,; Jong Duk Lee, both of Seoul, Rep. of Korea

[21] Appl. No.: 718,789

[22] Filed: Sep. 24, 1996

[30] Foreign Application Priority Data

Sep. 25, 1995 [KR] Rep. of Korea .................. 1995-31635

[51] Int. Cl.[6] .................. H01L 21/00
[52] U.S. Cl. .................. 438/20; 438/28
[58] Field of Search .................. 438/20, 22, 23, 438/30, 28

[56] References Cited

U.S. PATENT DOCUMENTS

| | | | |
|---|---|---|---|
| 5,212,426 | 5/1993 | Kane | 315/169 |
| 5,359,256 | 10/1994 | Gray | 313/169 |
| 5,448,132 | 9/1995 | Komatsu | 313/495 |
| 5,455,196 | 10/1995 | Frazier | 148/DIG. 172 |

*Primary Examiner*—Tuan H. Nguyen
*Attorney, Agent, or Firm*—Dilworth & Barrese

[57] ABSTRACT

The present invention provides field emitter arrays (FEAs) having incorporated with metal oxide semiconductor field effect transistors (MOSFETs) and method for fabricating the same which realizes a simultaneous fabrication of two kinds of devices, namely, the FEA and MOSFETs, by using common processing steps among the processes of fabricating the Si-FEA or the metal FEA and the MOSFETs, wherein the method comprises steps of forming field emission tips and active regions for MOSFETs by oxidizing selected portions of the silicon nitride layer, forming a gate insulating oxide layers for the FEA and field oxide layers for MOSFETs simultaneously by the LOCOS method and connecting gate electrodes(row line) and cathode electrodes (column line) of the FEA to MOSFETs.

2 Claims, 10 Drawing Sheets

METHOD FOR FABRICATING A FIELD EMITTER ARRAY INCORPORATED WITH METAL OXIDE SEMICONDUCTOR FIELD EFFECT TRANSISTORS

BACKGROUND OF THE INVENTION

1. Field of the Invention

The present invention relates to a field emitter array (FEA) incorporated with metal oxide semiconductor field effect transistors (MOSFETs) and a method for fabricating the same, and more particularly to an FEA which is fabricated on a single substrate together with MOSFETs for driving the FEA, thereby achieving reduction in drive power and improvement in the uniformity of pixels in a field emission display.

2. Description of the Prior Art

Recently, active research and development have been carried out for the field emission display (FED) which is a kind of flat panel displays (FPD).

Generally, such an FED is basically comprised of an FEA to emit electrons and a circuit for driving the FEA. The FEA and its drive circuit are separately fabricated and then interconnected with each other to form a display module.

In order to electrically connect the FEA with its drive circuit, therefore, an additional process is required. This results in increase of the manufacturing cost of the FED.

There is also a difficulty in reducing the drive voltage for the FEA where the FEA and its drive circuit are separately fabricated and then interconnected with each other. Furthermore, it is difficult to obtain the uniformity in coupling pixels of the FED and the MOSFETs. As the result, it is difficult to obtain uniformity of pixels.

SUMMARY OF THE INVENTION

The present invention has been made in view of the above-mentioned problems involved in the prior art, and an object of the invention is to eliminate the additional process required in connecting the FEA with MOSFETs adapted to drive the FEA by fabricating the FEA on a single substrate together with the MOSFETs, thereby not only achieving substantial reduction of the manufacturing cost of the FED, but also obtaining the uniformity of pixels of the FEA.

In order to accomplish this object, the present invention is intended to fabricate the silicon-FEA and the metal-FEA by simultaneously with MOSFETs using the conventional thermal silicon oxidation method and the local oxidation of silicon (LOCOS) method, respectively.

DESCRIPTION OF THE DRAWINGS

Other objects and aspects of the present invention will become apparent from the following description of embodiments with reference to the accompanying drawings in which.

DETAILED DESCRIPTION OF THE PREFERRED EMBODIMENTS

An example of a conventional method for fabricating a silicon-FEA using the thermal silicon oxidation method is illustrated in FIGS. 1A to 1E which show sequential steps of the method, respectively. This method is disclosed in, for example, the Korean Patent Laid-open Publication No. 95-9786.

Figure 1A:
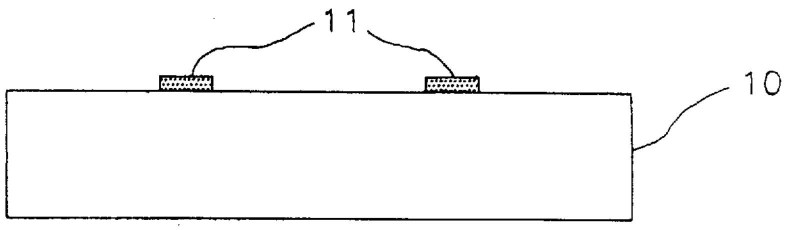
FIG.1A (Prior Art)
FIGS. 1A to 1E are sectional views respectively illustrating sequential steps of a conventional method for fabricating a silicon-FEA, which is applied to the present invention.

In the conventional method, a doped silicon substrate 10, which will serve as cathode electrodes for the resultant FEA, is first prepared and oxide layer disk patterns are then formed on the silicon substrate 10, as shown in FIG. 1A. The oxide layer disk patterns 11 are formed by thermally oxidizing the silicon substrate 10 to form an oxide layer thereon and then patterning the oxide layer using the photolithography method.

Figure 1B:
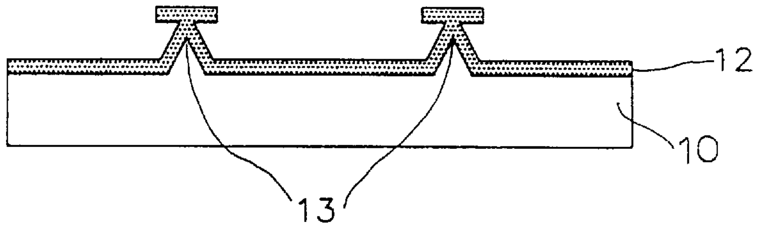
FIG.1B (Prior Art)

After etching the silicon substrate 10, a thin silicon oxide layer 12 is formed over the silicon substrate 10 by the primary oxidation, thereby forming cone-shaped field emission tips 13, as shown in FIG. 1B.

Figure 1C:
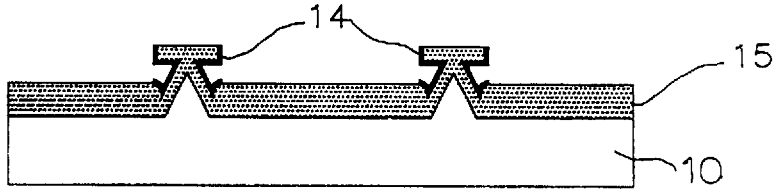
FIG.1C (Prior Art)

Thereafter, a silicon nitride layer 14 is formed over the silicon oxide layer 12 by a low pressure chemical vapor deposition (LPCVD) method, as shown in FIG. 1C. The silicon nitride layer 14 is then partially removed by means of a dry etching process so that only its side wall parts of the tips 13 may be left. The secondary oxidation is conducted to form a gate insulating layer 15. During the secondary oxidation, the side walls serve to prevent the field emission tips 13 from becoming blunt.

Figure 1D:
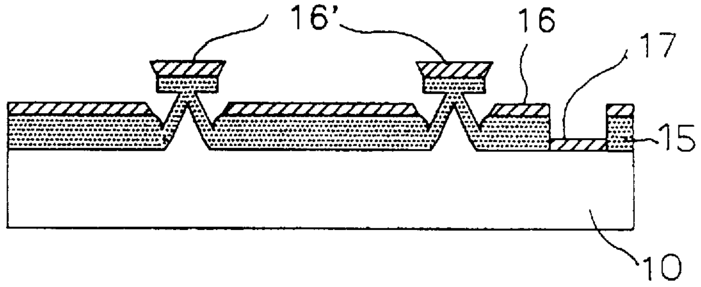
FIG.1D (Prior Art)

Subsequently, the silicon nitride layer 14 is completely removed as shown in FIG. 1D. The gate insulating layer 15 is also partially removed so that the cathode contact with the external drive circuit may be made. Over the gate insulating layer 15, gate metal is deposited by the electron gun type deposition device, thereby forming gate electrodes 16 and cathode contacts 17.

Figure 1E:
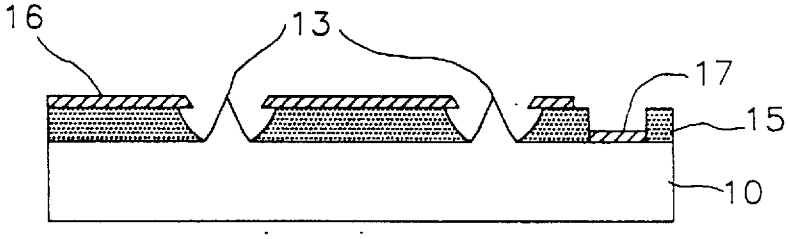
FIG.1E (Prior Art)

Thereafter, the oxide layer around each field emission tip 13 is removed together with the metal layer 16' deposited over the field emission tip 13 by means of a lift-off process using a wet etching method. Finally, the gate patterning is carried out. Thus, a product with the structure shown in FIG. 1E is obtained.

Another known method applied to the present invention is illustrated in FIGS. 2A to 2G. The method for fabricating a metal-FEA using the so-called LOCOS method will now be described in brief in conjunction with FIGS. 2A to 2G. This method is disclosed in, for example, the U.S. patent application No. 08/538,986.

Figure 2A:
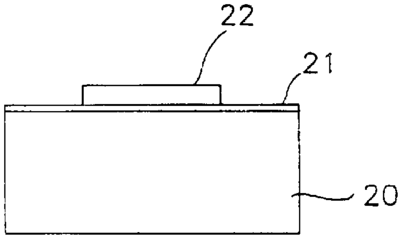
FIG.2A (Prior Art)
FIGS. 2A to 2G are sectional views respectively illustrating sequential steps of another conventional method for fabricating a metal-FEA using the LOCOS process, which is applied to the present invention.

By using the conventional method, a doped silicon substrate 20, which will serve as the cathode electrodes of the resultant FEA, is first prepared, and a thin oxide layer 21 is then formed on the silicon substrate 20 by thermally oxidizing the silicon substrate 20, as shown in FIG. 2A. A silicon nitride layer is then deposited to a desired thickness (for example, 1,600 Å) over the oxide layer 21.

The silicon nitride layer serves to prevent the silicon substrate 20 beneath it from being oxidized in the subsequent oxidation step.

Thereafter, silicon nitride layer patterns 22 with, for example, a diameter of 1.4 μm, are formed on the oxide layer 21 by using the photolithography method using a photomask aligner, as shown in FIG. 2A.

Figure 2B:
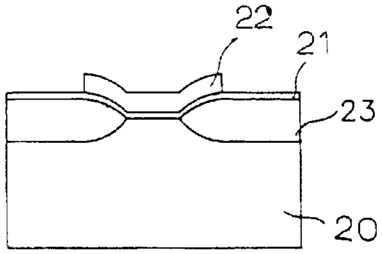
FIG.2B (Prior Art)

A wet or dry oxidation process is then performed for the silicon substrate 20. As the result of this process, a thick oxide layer is formed on the silicon substrate 20 in such a manner that it has a large thickness in the region where the silicon nitride layer patterns 22 are not disposed, while having a bird's beak shape disposed beneath the edge of each silicon nitride layer pattern 22, as shown in FIG. 2B.

During its formation, the oxide layer serves to lift edge portions of the silicon nitride layer patterns 22. Thus, the resulting structure has the cross-sectional shape as shown in FIG. 2B. The oxide layer will serve as the insulating layer 23 between the cathodes and gate electrodes, when the resulting device operates.

The silicon nitride layer patterns 22 are subsequently wet etched so that they may be completely removed. The oxide layer is then etched to the depth corresponding to the thickness obtained at the step in FIG. 2A, namely, a depth required to expose the silicon substrate 20 and the silicon substrate 20 is partially exposed at its surface. Accordingly, the gaps between the adjacent insulating layers 23, which consequently define the diameters of the gate holes to be subsequently formed, become considerably smaller than the initial diameters of the silicon nitride layer patterns 22 due to the oxidation occurring in the formation of the oxide layer 21.

Figure 2C:
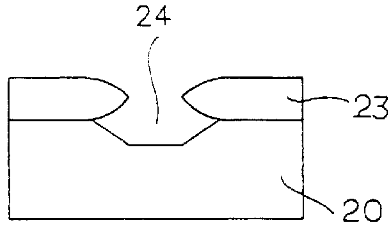
FIG.2C (Prior Art)

The silicon substrate 20 is then wet or dry etched at its exposed portion. By this etching process, a FEA shown in FIG. 2C is obtained without substantially affecting the shape of the insulating layers 23. Thus, gate holes 24 are prepared in the silicon substrate 20.

When the silicon substrate 20 is dry etched, it is desirable that $SF_6$ gas and low electric power are used. Under these conditions, it is possible to obtain a desired undercut shape without affecting the insulating layers 23. Of course, the etching method is not limited to the above-mentioned one.

Figure 2D:
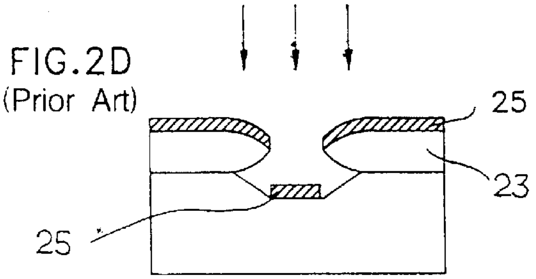
FIG.2D (Prior Art)

Thereafter, the silicon substrate 20 is mounted on an electron gun type deposition device to form a gate electrode layer 25 on the silicon substrate 20 as shown in FIG. 2D. The gate electrode layer 25 is formed by depositing a metal material over the surface of the silicon substrate 20 in such a manner that it is injected perpendicularly with respect to the surface of the silicon substrate 20. At this process, no metal material is deposited on lower surfaces of the insulating layers 23.

Molybdenum, niobium, chromium or hafnium may be used as the deposition material. Of course, the deposition material is not limited to those as above.

The subsequent process will then be conducted by using a method so called "Spindt process".

Figure 2E:
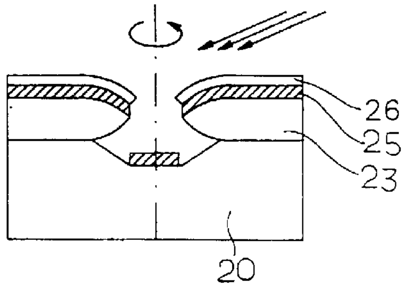
FIG.2E (Prior Art)

That is, the silicon substrate 20 is mounted on the electron gun type deposition device to form a parting layer 26 on the gate electrode layer 25 as shown in FIG. 2E. The formation of the parting layer 26 is achieved by depositing a deposition material over the gate electrode layer 25 in such a manner that the deposition material is injected at a grazing angle with respect to the surface of the silicon substrate 20. At this time, no deposition material is deposited on the surface of the silicon substrate 20. As the material of the parting layer 26, aluminum, aluminum oxide or nickel may be used.

Figure 2F:
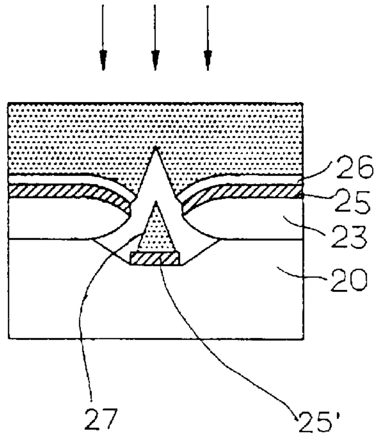
FIG.2F (Prior Art)

Thereafter, field emission tips 27 are formed by injecting a metal perpendicularly with respect to the surface of the silicon substrate 20, as shown in FIG. 2F. Since the metal to be deposited is injected perpendicularly with respect to the surface of the silicon substrate 20, it is deposited over both the metal layer 25' disposed on the silicon substrate 20 and the parting layer 26. Accordingly, the gaps between the adjacent gate electrode layers 25 are gradually reduced and finally closed as the deposition of the metal material advances. As the result, the field emission tips 27 as formed have the cone shapes.

Molybdenum, niobium or hafnium may be used as the material of the field emission tips 27. Of course, the material is not limited to those as above.

Figure 2G:
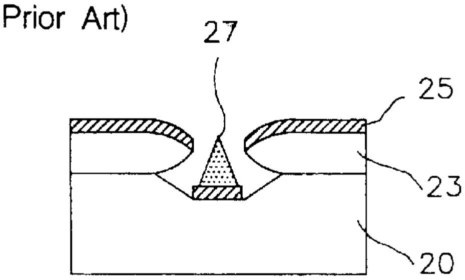
FIG.2G (Prior Art)

Subsequently, only the parting layer 26 disposed over the gate electrode layers 25 are selectively etched. By this process, the field emission tip material deposited over the gate electrode layers 25 are lifted off from the silicon substrate together with the parting layers 26'. Thus, a metal-FEA having the structure shown in FIG. 2G is obtained.

In particular, the metal-FEA fabricated by the above-mentioned process may have gate holes with the diameters smaller than the sizes of the mask patterns. Accordingly, reduction in drive voltage can be easily achieved.

The present invention realizes the simultaneous fabrication of FEA and MOSFET by adding several masking steps to the above-mentioned process of fabricating a silicon-FEA or metal-FEA.

Now, preferred embodiments of the present invention will now be described with reference to the accompanying drawings.

Figure 3:
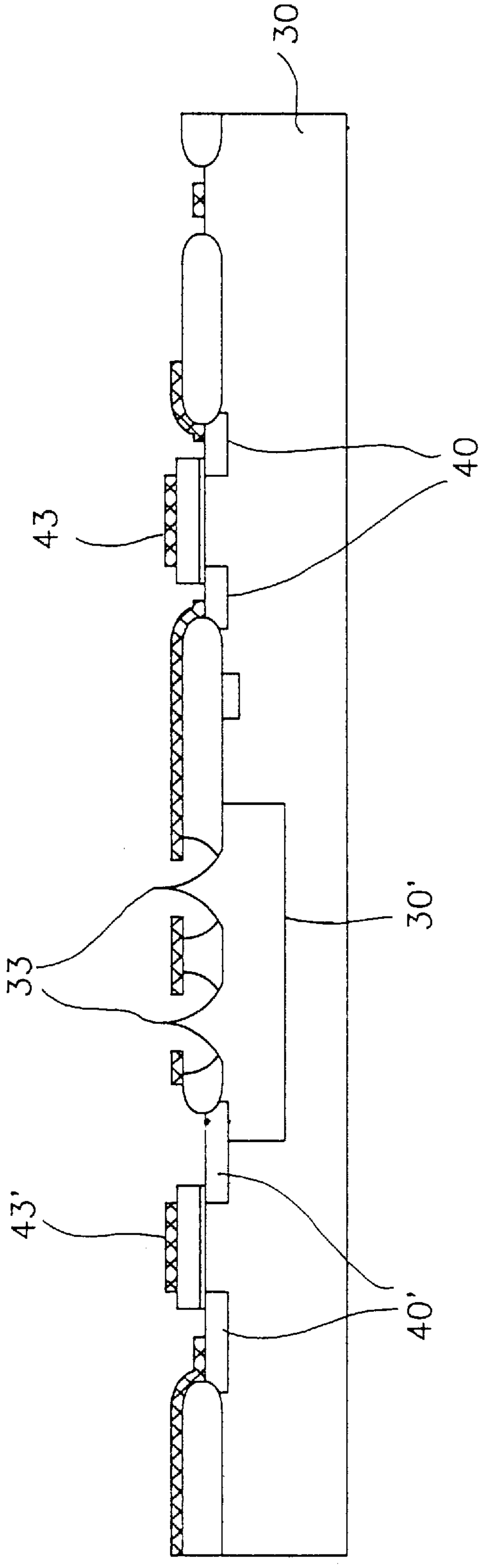
FIG. 3 is a sectional view illustrating an FEA incorporated with MOSFETs according to an embodiment of the present invention.
Figure 4:
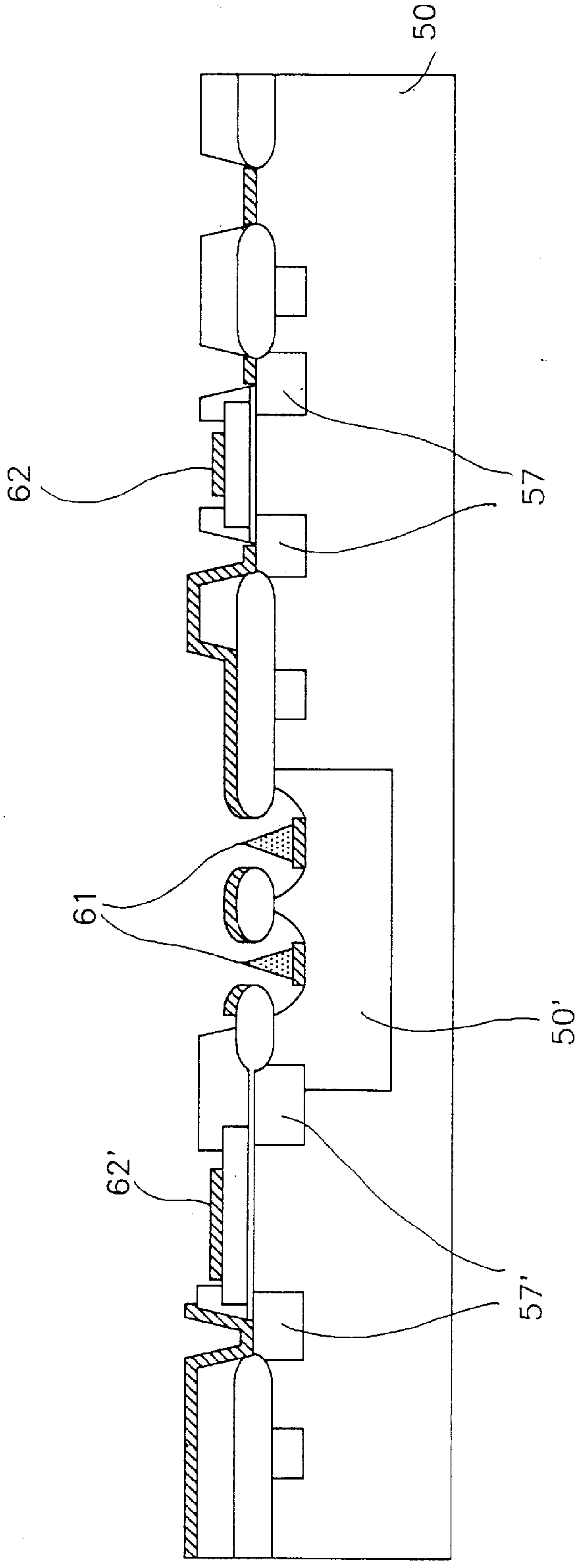
FIG. 4 is a sectional view illustrating anther FEA incorporated with MOSFETs according to another embodiment of the present invention.

FIGS. 3 and 4 are sectional views respectively illustrating the FEA incorporated with MOSFETs. The FEA shown in FIG. 3 or 4 includes a P-type silicon substrate 30 or 50 formed with an $n^+$-doped silicon layer 30' or 50' serving as the cathode electrodes of the display, in which a FEA is formed on a certain portion of the silicon substrate 30 or 50, while MOSFETs being formed on the remaining portion of the silicon substrate 30 or 50. The FEA is provided with cone-shaped field emission tips 33 or 61 to emit electrons. The MOSFETs have $n^+$sources and drains 40 and 40' or 57 and 57', and gate electrodes 43 and 43' or 62 and 62'. According to the present invention, the FEA is fabricated simultaneously with the MOSFETs for driving the FEA.

Embodiment 1

A method for fabricating the FEA of FIG. 3 incorporated with MOSFETs according to the first embodiment of the present invention will now be described in detail with reference to FIGS. 5A to 5M.

Figure 5A:
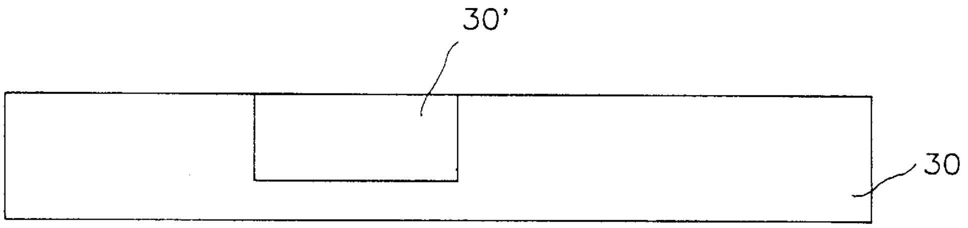
FIGS. 5A to 5M are sectional views respectively illustrating sequential steps of a method for fabricating the FEA incorporated with MOSFETs of FIG. 3

In this embodiment, a P-type silicon substrate 30 is first prepared, and an $n^+$-doped silicon layer 30' serving as the cathode electrodes, namely column line of the display, is formed in a certain portion of the silicon substrate 30 by an appropriate method such as $POCl_3$ doping, as shown in FIG. 5A.

Figure 5B:
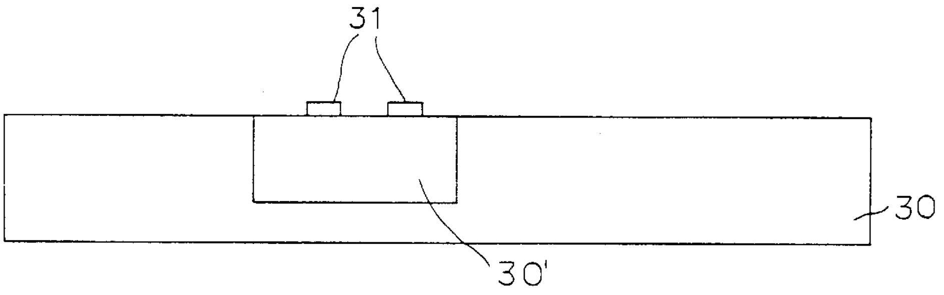

Over the silicon layer 30', an oxide layer is then formed by means of the chemical vapor deposition (CVD) or thermal oxidation. Oxide layer disk patterns 31 in the micron size are then formed by patterning the oxide layer with the photolithography method, as shown in FIG. 5B.

Figure 5C:
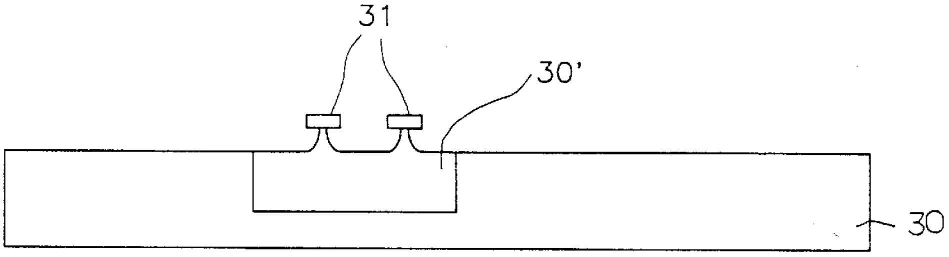
Figure 5D:
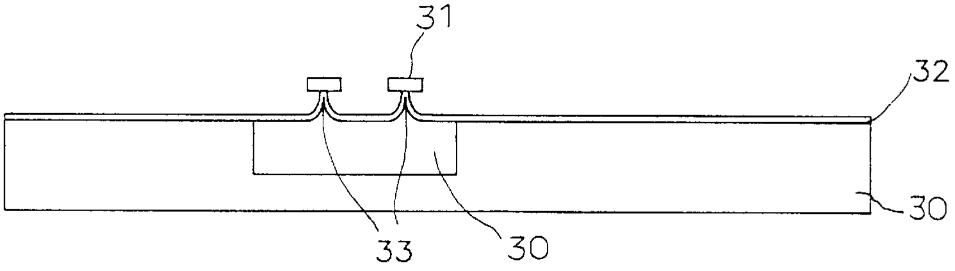

After isotropically etching the silicon substrate 30 and silicon layer 30' as shown in FIG. 5C, a thin silicon oxide layer 32 is formed over the silicon substrate 30 and silicon layer 30' by the primary oxidation, thereby forming cone-shaped field emission tips 33, as shown in FIG. 5D.

Figure 5E:
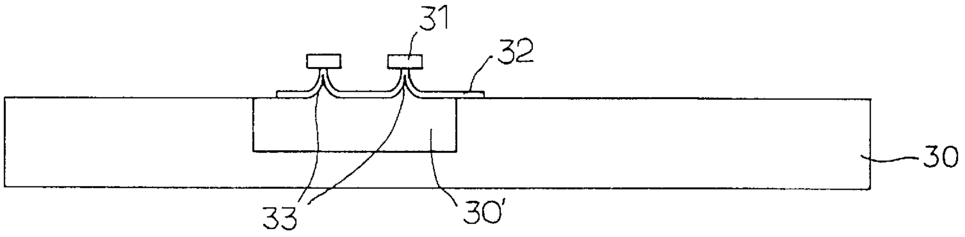

Thereafter, the oxide layer 32 is partially removed at its portions, on which first and second MOSFETs will be disposed, by the photolithography method, as shown in FIG. 5E.

Figure 5F:
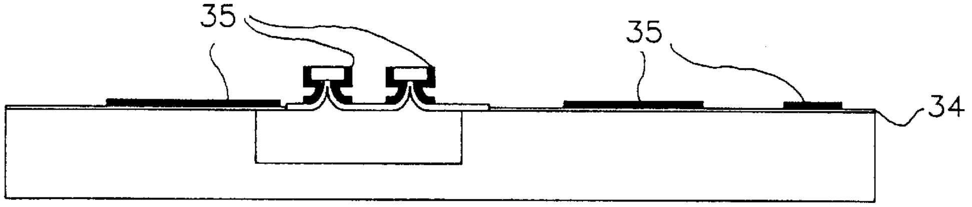

A buffer oxide layer 34 is deposited to a thickness of 400 to 1,200 Å over the silicon substrate 30 and silicon layer 30' exposed after the partial removal of the oxide layer 32, us shown in FIG. 5F. Subsequently, a silicon nitride layer 35 is deposited over the buffer oxide layer 34 by the LPCVD method. As shown in FIG. 5F, the silicon nitride layer 35 is then anisotropically etched so that it can be removed except for its portions corresponding to active regions of the MOSFETs, namely, the active region of the first MOSFET defined on the buffer oxide layer 34 of the silicon substrate 30 and a portion of the $n^+$-doped silicon layer 30' serving as cathode electrodes. At this time, portions of the silicon nitride layer 35, which serve as side walls for preventing field emission tips 33 as subsequently formed from being oxidized, are also left. The side walls serve to keep the field emission tips 33 sharp.

Figure 5G:
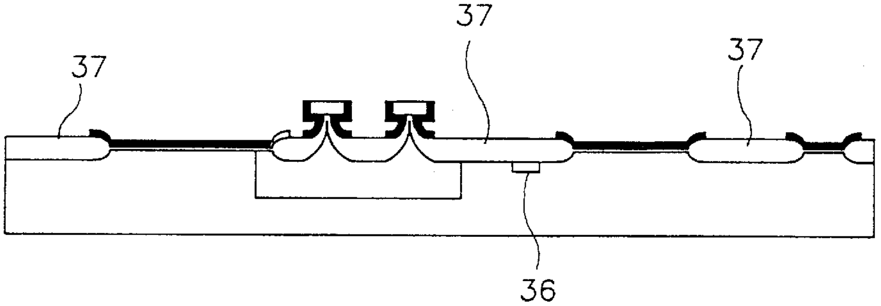

In order to provide a desired isolation between adjacent pixels, or pixels and transistors in case of being applied to a display, photo masking and boron doping are then carried out, thereby forming isolated regions 36 as shown in FIG. 5G. Subsequently, gate insulating layers 37 for the FEA and field oxide layers 37 for the first and second MOSFETs are formed by the LOCOS process.

As shown in FIGS. 5F and 5G, the present invention realizes fabrication of two kinds of devices, namely, the FEA and MOSFETs, on a single substrate by using some processing steps, which can be commonly used for fabricating both of the FEAs and the MOSFETs. In other words, the field emission tips 33 and the active regions of first and second MOSFETs are simultaneously formed by anisotropically dry etching the selected parts of the silicon nitride layer 35. Also, the gate insulating oxide layers 37 of the FEA and the field oxide layers 37 of the MOSFETs are simultaneously formed by the LOCOS process.

Figure 5H:
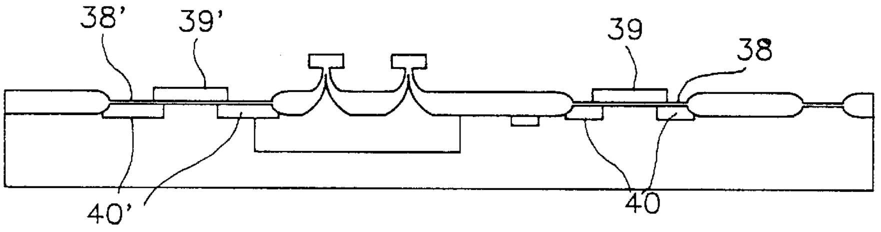
Figure 5I:
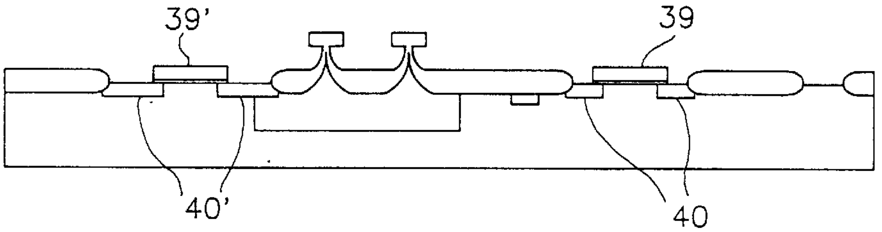

Subsequently, the remaining silicon nitride layers 35 and buffer oxide layers 34 are completely removed, as shown in FIG. 5H. Gate oxide layers 38 and 38' for the first and second MOSFETs are then formed through the thermal oxidation process. Impurity ions are then implanted in the P-type silicon substrate 30 for the portions disposed beneath the gate oxide layers 38 and 38' so as to control the threshold voltage of the first and second MOSFETs.

Polysilicon layers are then deposited over the gate oxide layers 38 and 38', respectively. These polysilicon layers are doped with $POCl_3$ and then patterned by the photolithography method, thereby forming gates 39 and 39' for the first and second MOSFETs.

$N^+$sources and drains 40 and 40' are then formed by the high concentration n-type ion implantation method.

Figure 5J:
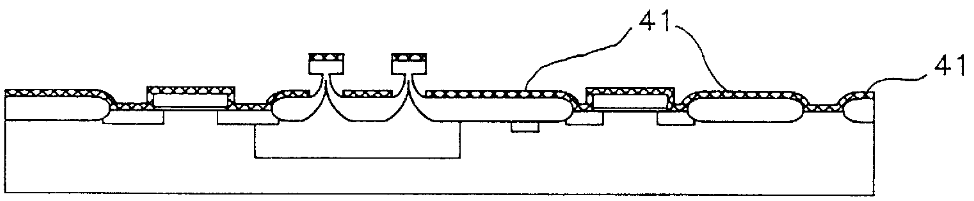

Patterning for forming contacts is then conducted by performing the photolithography method as shown in FIG. 51. Using the electron gun type deposition device, a metal layer 41 is then deposited over the entire exposed surface of the resulting structure to provide the gate electrodes of the FEA, and gates, source and drain electrodes of the first and second MOSFETs, as shown in FIG. 5J.

Figure 5K:
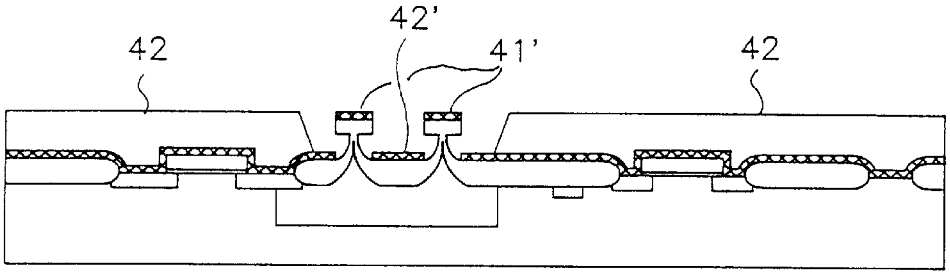

Thereafter, a photoresist layer 42 is deposited over the resulting device, as shown in FIG. 5K. The photoresist layer 42 is then patterned to open the region where the FEA is to be arranged.

Figure 5L:
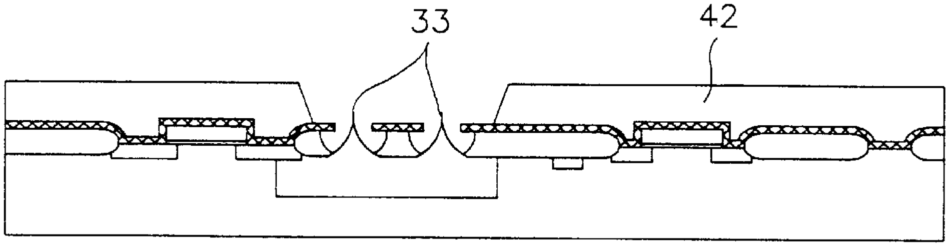
Figure 5M:
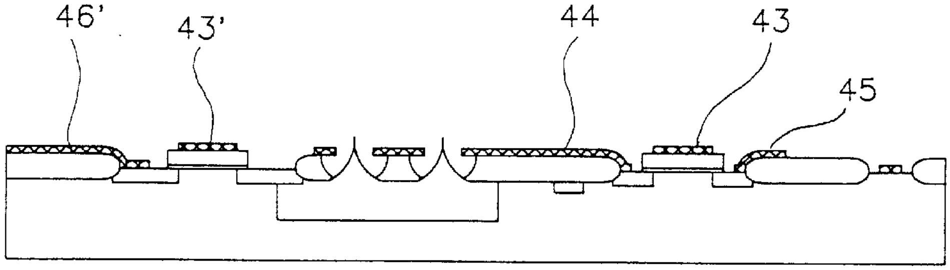

The oxide layer around each field emission tip 23 is removed together with the metal layer 41' deposited over the field emission tip 23 with a lift-off process by the wet etching, as shown in FIG. 5L. Finally, gate patterning step is carried out after removing the photoresist layer 42. Thus, a FEA incorporated with the MOSFETs is obtained as shown in FIG. 5M.

Embodiment 2.

A method for fabricating the FEA of FIG. 4 incorporated with MOSFETs according to the second embodiment of the present invention will now be described in detail with reference to FIGS. 6A to 6J.

Figure 6A:
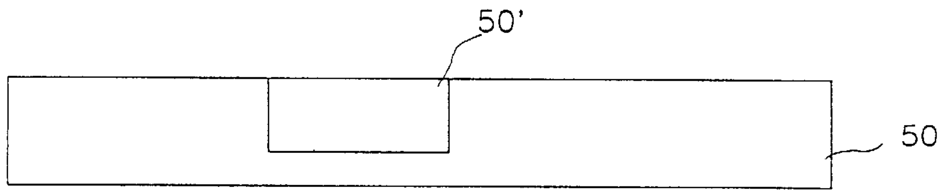
FIGS. 6A to 6J are sectional views respectively illustrating sequential steps of a method for fabricating the FEA incorporated with MOSFETs of FIG. 4.

In this embodiment, a P-type silicon substrate 50 is first prepared, and an $n^+$-doped silicon layer 50', which serves to provide cathode electrodes, namely, column line of a display, is formed in a certain portion of the silicon substrate 50 by an appropriate method such as $POCl_3$ doping, as shown in FIG. 6A.

Figure 6B:
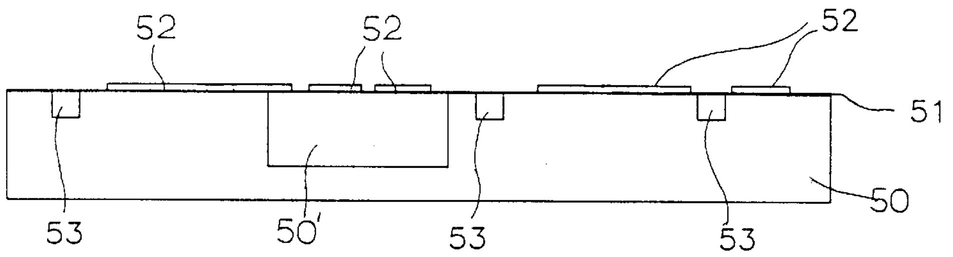

A thin oxide layer 51 is then formed over the resulting product by thermally oxidizing the silicon substrate 50 and silicon layer 50', as shown in FIG. 6B. A silicon nitride layer is then deposited over the oxide layer 51. Thereafter, silicon nitride layer patterns 52 in the micron size are formed over the oxide layer 51, corresponding to active regions of the MOSFETs and the region where gate holes of the FEA, will be formed by using the photolithography technique.

$P^+$ions are then doped in the portions of the silicon substrate 50 exposed after the partial removal of the silicon nitride layer, thereby forming isolated regions for providing a desired isolation between cathodes, and between pixels and transistors.

Figure 6C:
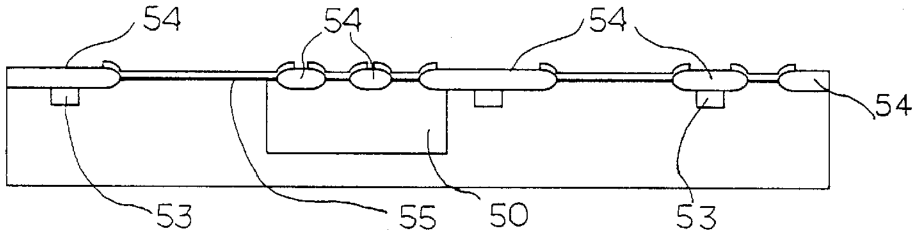

Thereafter, the silicon substrate 50 is oxidized, thereby forming a thick oxide layers in the regions where the silicon nitride layer was removed, as shown in FIG. 6C. Thus, insulating oxide layers 54 for the FEA and field oxide layers 54 for the MOSFETs are formed.

The remaining silicon nitride layers 52 and thin oxide layers 51 are then completely removed. Thermal oxidation is subsequently conducted to form an oxide layer (not shown). Thereafter, impurity ions are implanted in the desired portions of the P-type silicon substrate 50 so as to control the threshold voltage of the first and second MOSFETs, and the oxide layer is then removed. In this state, gate oxide layers 55 and 55' for the MOSFETs are then formed on the resulting structure in accordance with the thermal oxidation process.

Figure 6D:
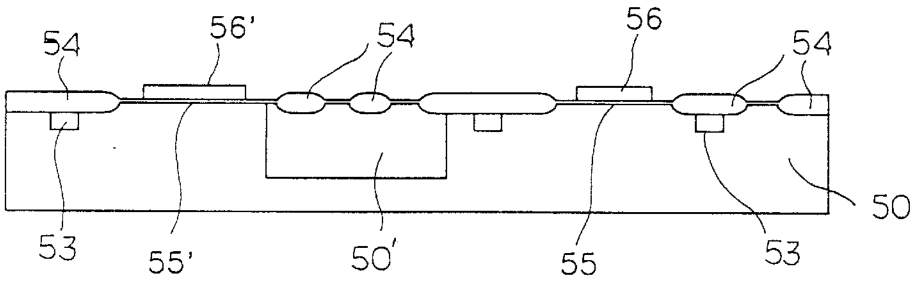

Polysilicon layers are then deposited over the gate oxide layers 55 and 55', respectively, as shown in FIG. 6D. These polysilicon layers are doped with $n^+$ions and then patterned, thereby forming gates 56 and 56' for the first and second MOSFETs.

Figure 6E:
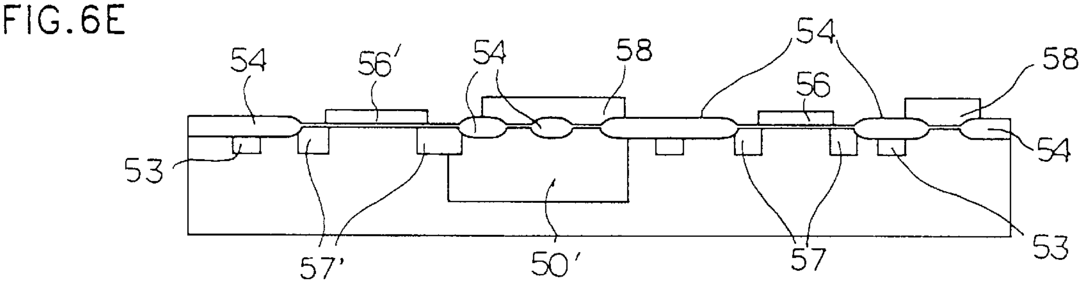

Formation of $n^+$sources and drains 57 and 57' are then carried out by using a high concentration n-type ion implantation process, as shown in FIG. 6E. At this time, portions of the silicon substrate where impurity ions should not be implanted are covered with the photoresist layer 58.

Figure 6F:
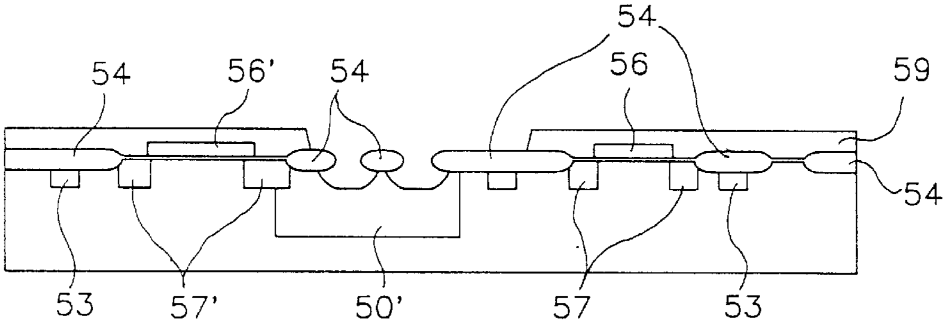

A low temperature oxide (LTO) layer 59 is then deposited over the entire exposed upper surface of the resulting structure, as shown in FIG. 6F. The LTO layer 59 is subsequently patterned by using the photolithography method so as to remove the portion disposed in a region where the FEA will be formed. The $n^+$-doped silicon layer 50' is then partially etched so as to remove its desired portions.

Figure 6G:
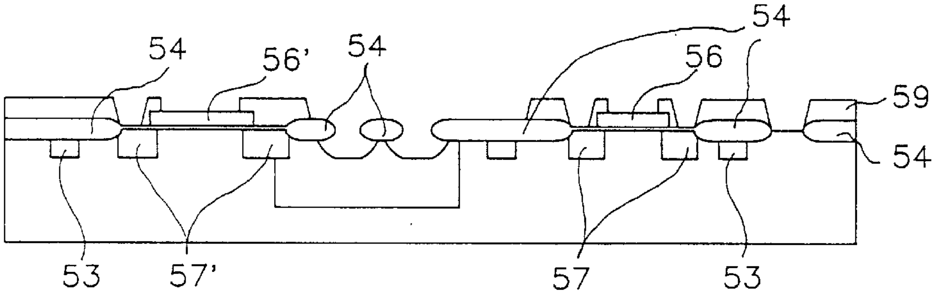
Figure 6H:
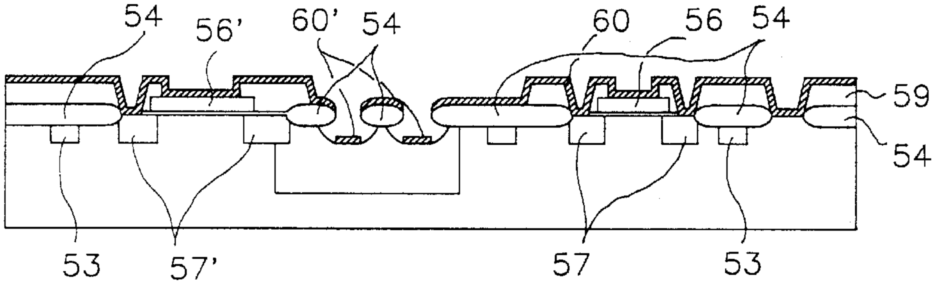
Figure 6I:
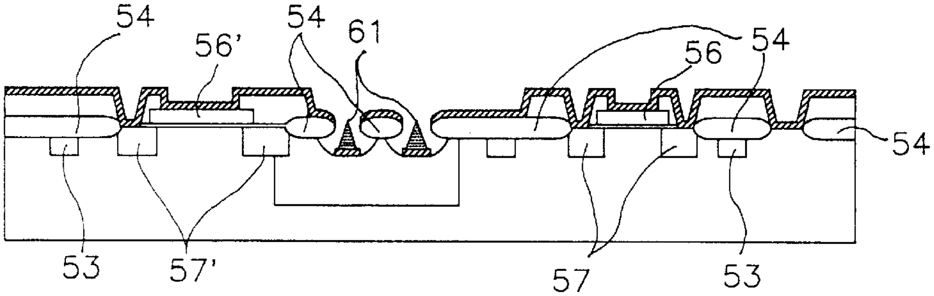

Patterning for forming contacts is then conducted by performing the photolithography method as shown in FIG. 6G. Using the electron gun type deposition device, a metal layer 60 is then deposited over the entire exposed surface of the resulting structure in such a manner that the metal is injected perpendicularly with respect to the surface of the silicon substrate 50, as shown in FIG. 6I.

Thereafter, the silicon substrate 50 is mounted on the electron gun type deposition device to form a parting layer (not shown) on the metal layer 60. The parting layer is formed by depositing a deposition material over the metal layer 60 in such a manner that it is injected at a grazing angle with respect to the surface of the silicon substrate 50. At this time, no deposition material is deposited on the surface of the silicon substrate 50.

Thereafter, field emission tips 61 are formed by injecting a metal material perpendicularly with respect to the surface of the silicon substrate 50. Subsequently, only the parting layer is selectively etched. By this process, the field emission tip material deposited over the metal layer 60 is lifted off from the silicon substrate together with the parting layer.

Figure 6J:
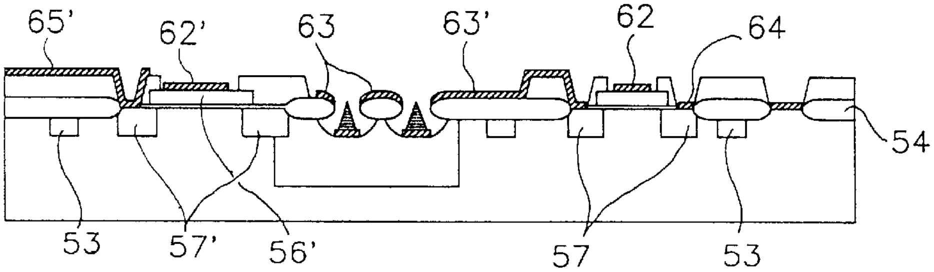

Finally, unnecessary portions of the resulting device are removed by the photolithography process, thereby forming gate electrodes 63 and 63' of the FEA and gate electrodes 62 and 62 ' source electrodes 63' and 65' and drain electrodes 64 of the first and second MOSFETs. Thus, a product with the structure shown in FIG. 6J is obtained.

Figure 7:
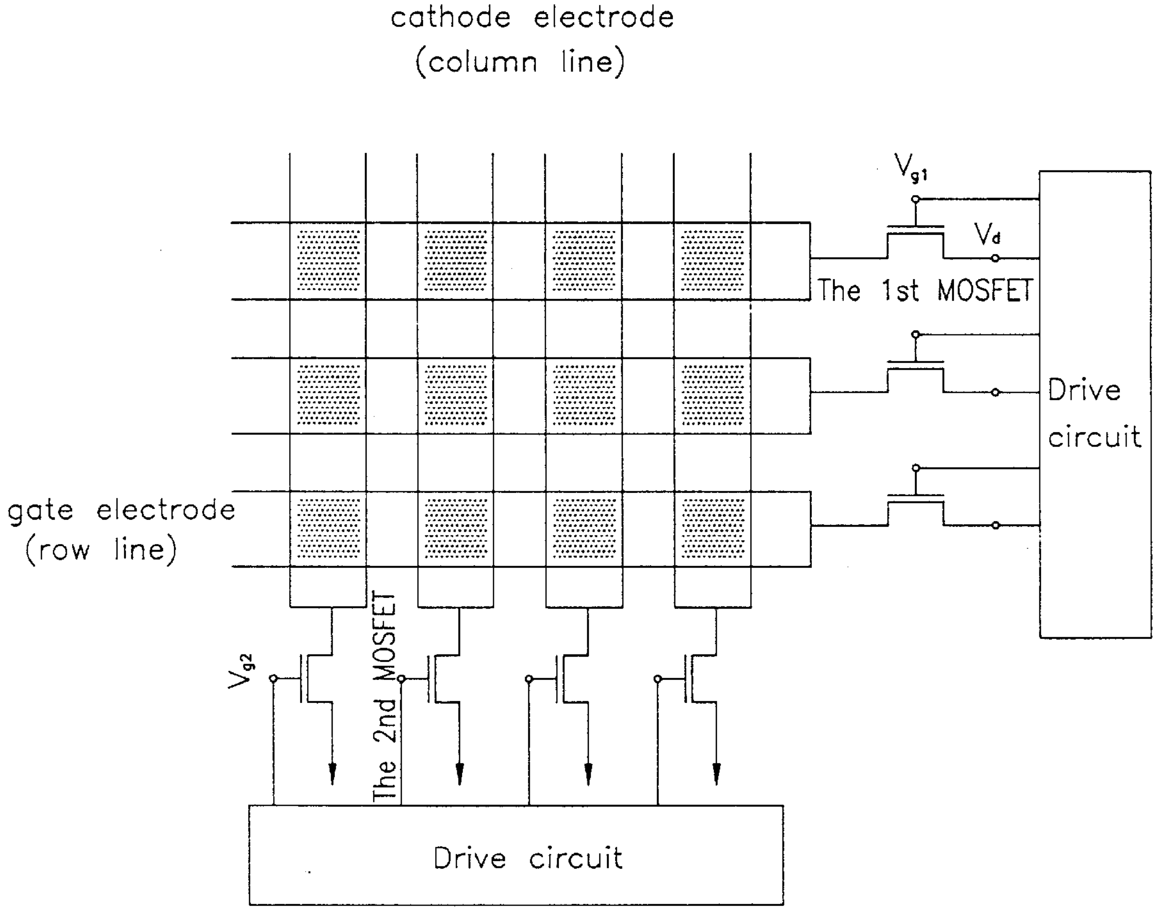
FIG. 7 is a block diagram illustrating an FED comprising the product according to the present invention.

FIG. 7 is a block diagram illustrating an FED fabricated with the products according to the present invention. In the FED, MOSFETs are connected to the gate electrodes on row lines of the FEA and to cathode electrodes on column lines of the FEA. In FIG. 7, the first MOSFET is connected to associated gate electrodes of the FEA so that it can apply voltage to the gate electrodes.

When a voltage $V_{g1}$ which is higher than a threshold voltage $V_{\tau}$ is applied to the gate terminal of the first MOSFET, it activates the first MOSFET. As a result, a drain voltage $V_d$ from the activated first MOSFET is applied to the associated gate electrodes of the FEA.

On the other hand, the second MOSFET connected to associated cathode electrodes of the FEA serves to ground or float the associated cathode electrodes. That is, when a voltage $V_{g2}$ which is higher than a threshold voltage $V_{\tau}$ is applied to the gate terminal of the second MOSFET, it activates the second MOSFET, thereby grounding the associated cathode electrodes of the FEA.

The second MOSFET may also serve to improve the uniformity among cathode electrodes arranged on column lines of the FEA. This function can be obtained by varying the gate voltage of the second MOSFET, thereby adjusting cathode current.

As apparent from the above description, the present invention provides an FEA which is fabricated on a single substrate together with MOSFETs to drive the FEA, thereby enabling the control of the drive voltage of the FEA by the MOSFETs connected to the FEA. Improvement in the uniformity among pixels in the FED using the FEA is also possible. It is also possible to eliminate an additional process required in connecting the FEA and MOSFETs together. Accordingly, a substantial reduction in the manufacturing cost of the FED is achieved.

Furthermore, the present invention may be directly applied to the manufacture of a display module using a combination of the FEA and its drive circuit which is incorporated with the FEA.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a Field Emitter Array (FEA) incorporated with MOSFETs, wherein oxide layer disk patterns are formed by thermally oxidizing a $n^+$-doped silicon substrate to form a first oxide layer and then patterning said first oxide layer, and cone-shaped field emission tips are formed by isotropical etching and oxidizing the silicon substrate, further comprising the steps of:

forming a second silicon oxide layer over the silicon substrate on which said field emission tips are formed;

removing said second oxide layer at its portions on which MOSFETs will be disposed;

depositing a buffer oxide layer over the remaining portion of the silicon substrate exposed after the partial removal of said second oxide layer;

depositing a silicon nitride layer over said buffer oxide layer by the LPCVD method;

anisotropically dry etching said silicon nitride layer so that it can be removed except for the portions which serve as side walls for protecting the field emission tips and other portions corresponding to active regions of the MOSFETs;

forming isolated regions in said substrate by photo masking and boron doping in order to provide desired isolation between adjacent pixels; and forming gate insulating layers for the FEA and field oxide layers for the MOSFETs simultaneously.

2. A method of fabricating a Field Emitter Array (FEA) incorporated with MOSFETs, wherein silicon nitride layer disk patterns are formed on an oxide layer formed by thermally oxidizing a $n^+$doped silicon layer on a P-type silicon substrate and then patterning the oxide layer by using the photo lithography technique, wet or dry-oxidation and wet or dry-etching are carried out to form gate holes, and cone-shaped field emission tips are formed by metal deposition, comprising the steps of:

forming the oxide layer over the silicon substrate and said $n^+$doped silicon layers;

depositing a silicon nitride layer over said oxide layer;

forming silicon nitride layer disk patterns on the portions of said oxide layer, corresponding to active regions of the MOSFETs and regions where the FEA will be formed, by the photolithography method;

forming isolated regions in said substrate by $p^+$doping the portions of the silicon substrate exposed after the partial removal of said silicon nitride layer in order to provide a desired isolation between adjacent pixels;

forming insulating oxide layers for the FEA and field oxide layers for the MOSFETs by oxidizing both of the silicon substrate and said silicon layer by the LOCOS method;

forming gates for the MOSFETs by depositing polysilicon on the gate oxide layers, formed by the thermal oxidation, and subsequent impurities implantation;

forming $n^+$sources and drains for the MOSFETs under said gate oxide layers by the high concentration $n^+$ion implantation;

depositing photoresist layers over the portions of the silicon substrate where the FEA will be formed;

depositing a low temperature oxide (LTO) layer over the entire exposed upper surface of the silicon substrate;

removing said LTO layer in the region where the FEA will be formed by using the photolithography process and etching said silicon layer;

depositing a metal layer in such a manner that the deposition material is injected perpendicularly with respect to the surface of the silicon substrate; and removing unnecessary field emission tip material together with a parting layer by using the lift-off process.

* * * * *